(12) United States Patent
Brunschwiler et al.

(10) Patent No.: US 7,713,789 B2
(45) Date of Patent: May 11, 2010

(54) SEMICONDUCTOR DEVICE WITH A HIGH THERMAL DISSIPATION EFFICIENCY

(75) Inventors: Thomas J. Brunschwiler, Thalwil (CH); Michel Despont, General-Werdmuellerstrasse (CH); Mark A. Lantz, Zürich (CH); Bruno Michel, Adliswil (CH); Peter Vettiger, Langnau am Albis (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/852,317

(22) Filed: Sep. 9, 2007

(65) Prior Publication Data

US 2008/0017978 A1 Jan. 24, 2008

Related U.S. Application Data

(63) Continuation of application No. 11/148,737, filed on Jun. 9, 2005, now Pat. No. 7,271,034.

(30) Foreign Application Priority Data

Jun. 15, 2004 (EP) .................................. 04405362

(51) Int. Cl.
*H01L 21/00* (2006.01)
(52) U.S. Cl. .................. 438/122; 257/706; 257/707; 257/712; 257/721; 257/722; 257/713; 257/714
(58) Field of Classification Search .......... 257/722, 257/723, 678, 686, 706, 707, 720, 787, 788, 257/789, 790, 791, 792, 782, 783, E22.105, 257/E23.08, E23.103, 712, 713, 714, 715, 257/716, 717, 718, 719, 721; 438/119, 118, 438/109, 122, 117, FOR. 413
See application file for complete search history.

(56) References Cited

U.S. PATENT DOCUMENTS

| | | | | |
|---|---|---|---|---|
| 5,842,275 A | * | 12/1998 | McMillan et al. | 29/840 |
| 6,351,384 B1 | * | 2/2002 | Daikoku et al. | 361/704 |
| 6,639,800 B1 | * | 10/2003 | Eyman et al. | 361/704 |
| 6,903,929 B2 | * | 6/2005 | Prasher et al. | 361/699 |
| 6,919,231 B1 | * | 7/2005 | Ramanathan et al. | 438/122 |
| 6,934,154 B2 | * | 8/2005 | Prasher et al. | 361/699 |
| 7,115,987 B2 | * | 10/2006 | Holalkere et al. | 257/713 |
| 7,271,034 B2 | * | 9/2007 | Brunschwiler et al. | 438/119 |
| 7,381,592 B2 | * | 6/2008 | Yoshimura | 438/122 |
| 2003/0017634 A1 | * | 1/2003 | Hirakata et al. | 438/22 |
| 2004/0113283 A1 | * | 6/2004 | Farnworth et al. | 257/782 |
| 2005/0006763 A1 | * | 1/2005 | Saimen | 257/734 |
| 2005/0093120 A1 | * | 5/2005 | Millik et al. | 257/678 |
| 2005/0139992 A1 | * | 6/2005 | Holalkere et al. | 257/706 |

* cited by examiner

*Primary Examiner*—Thao X Le
*Assistant Examiner*—Thanh Y Tran
(74) *Attorney, Agent, or Firm*—Michael J. Buchenhorner; Vazken Alexanian

(57) ABSTRACT

Provides semiconductor devices and method for fabricating devices having a high thermal dissipation efficiency. An example device comprises a thermally conducting structure attached to a surface of the semiconductor device via soldering. The thermally conducting structure is essentially formed of a thermally conducting material and comprises an array of freestanding fins, studs or frames, or a grid of connected fins. A process for fabricating such a semiconductor device includes forming a thermally conducting structure on a carrier and attaching the thermally conducting structure formed on the carrier to a surface of the semiconductor device via soldering.

4 Claims, 8 Drawing Sheets

SEMICONDUCTOR DEVICE WITH A HIGH THERMAL DISSIPATION EFFICIENCY

CROSS-REFERENCE TO RELATED APPLICATIONS

This application is a continuation of, and claims priority to, commonly-owned application Ser. No. 11/148,737, filed on Jun. 9, 2005, entitled "SEMICONDUCTOR DEVICE WITH A HIGH THERMAL DISSIPATION EFFICIENCY," now U.S. Pat. No. 7,271,034.

FIELD OF THE INVENTION

The present invention relates to a semiconductor device with a high thermal dissipation efficiency and to a method for fabricating the same.

BACKGROUND

In order to meet the demand for high clock frequencies of future computers, the integration density of current semiconductor devices as, for example, chips and multi-chip modules (MCM), in which a number of semiconductor chips are mounted on a common substrate generally in the face-down state, is continuously being increased. As a consequence, there arises the problem of increased heat dissipation due to the increase in power density.

Common cooling approaches include air cooling, as for example disclosed in the U.S. Pat. No. 5,471,366, which describes a multi-chip module and a fabrication process thereof. The multi-chip module comprises a plurality of semiconductor chips mounted on a common substrate and a plurality of thermally conductive blocks attached to the semiconductor chips. A resin package body encapsulates the semiconductor chips and the thermally conductive blocks together with the substrate. The resin package body furthermore has an upper surface flushing with the upper surfaces of the thermally conductive blocks. A heat sink carrying heat radiation fins is mounted onto the upper surface of the resin package body in such a way that a thermally contact is established between the heat sink and the upper surfaces of the thermally conductive blocks. Thus, heat dissipated from the semiconductor chips is transferred to the heat sink via the thermally conductive blocks and is radiated to the surrounding air from the heat radiation fins.

One disadvantage of this multi-chip module is that the heat transferred from the semiconductor chips to the air has to pass three boundary layers, so that the heat dissipation efficiency is reduced. Besides, the reworkability in case of defects or insufficient thermal connections is restricted due to the encapsulation of the thermally conductive blocks, the semiconductor chips and the substrate with the resin package body. Furthermore, in general air cooling approaches are quickly reaching their limits. As a consequence, alternative cooling concepts have to be pursued.

Other known cooling techniques include liquid coolants, which will be crucial for future midsize and portable computers in particular. The disadvantage of these cooling methods consists in the connection of liquid coolers to the surfaces of the semiconductor chips. In order to level out roughness and warp, a thick thermally interface between the chips and the liquid coolers is required which causes a high thermally resistance that deteriorates the cooling performance.

One of the currently used cooling methods is the so-called jet impingement cooling. The idea behind this cooling method is to spray a cooling fluid through nozzles directly onto the backside surface of the semiconductor chips in order to create a film of fluid thereon. Consequently, heat transfer to the cooling fluid is rendered easier. However, the cooling efficiency of jet impingement coolers is generally low due to the unstructured only flat impingement surface of the semiconductor chips.

Moreover, it is known to etch trenches into the backside of a silicon wafer which serve as microscopic fluid channels in the future semiconductor chips. This concept of micro-channel heat sinks is based on very short thermally conduction paths and a high surface enlargement factor and utilizes the good thermally conductivity of silicon. It has been shown that the highest cooling efficiencies are possible with channels having a width of 30 to 50 µm and a depth of 200 to 300 µm.

A drawback of this method is that surface enlargement of processor chips by deep trench etching of wafers causes yield reduction, either due to the deep trench etch process stability or due to mechanical fracture of the patterned surface. Therefore, the method is cost ineffective. Moreover, deep trench backside etching of wafers can cause process compatibility issue problems, does not allow a re-working of this process in case of defects and makes the semiconductor chips more fragile to breaking. As a consequence, such etching processes are not accepted in chip manufacturing.

SUMMARY OF THE INVENTION

It is an aspect of the present invention to provide a semiconductor device having a high thermal dissipation efficiency and a good mechanical stability, which is compatible to the existing semiconductor process technology and which provides the possibility of re-working in case of defects.

Another aspect of the present invention is to provide a method for fabricating a semiconductor device having a high thermal dissipation efficiency with minimal induction of stress to the semiconductor device (well below fracture strength of the device), even if different materials are used.

According to another aspect of the present invention, a semiconductor device comprising a thermally conducting structure attached to a surface of the semiconductor device via soldering is provided. The thermally conducting structure is essentially formed of a thermally conducting material and comprises an array of freestanding fins, studs or frames, or a grid of connected fins.

In an advantageous embodiment of the present invention, the semiconductor device further comprises a manifold layer attached to the thermally conducting structure. By using a manifold layer, it is possible to supply a cooling liquid or water to the structural elements of the thermally conducting structure. Thereby, a very high cooling efficiency of the semiconductor device can be obtained.

In another advantageous embodiment of the present invention, the semiconductor device is integrated into a device for jet impingement cooling. Due to the fact that the surface of the semiconductor device is enlarged by the thermally conducting structure, a good cooling performance of the semiconductor device can be achieved.

According to another aspect of the present invention, a method for fabricating a semiconductor device is provided. The present invention can in particular be used to fabricate a multi-chip module having a high thermal dissipation efficiency. Accordingly, in yet another advantageous embodiment of the present invention, the semiconductor device comprises at least two semiconductor chips attached to a common substrate. Thereby, the method includes the step of attaching the thermally conducting structure to the surfaces of the semiconductor chips.

BRIEF DESCRIPTION OF THE DRAWINGS

These and other aspects and features of the present invention will become clear from the following description taken in conjunction with the accompanying drawings, in which.

DETAILED DESCRIPTION OF THE INVENTION

The present invention provides semiconductor devices having a high thermal dissipation efficiency and a good mechanical stability, which are compatible to the existing semiconductor process technology and which provides the possibility of re-working in case of defects.

The present invention also provides methods for fabricating a semiconductor device having a high thermal dissipation efficiency with minimal induction of stress to the semiconductor device (well below fracture strength of the device), even if different materials are used.

The present invention also provides a semiconductor device comprising a thermally conducting structure attached to a surface of the semiconductor device via soldering. The thermally conducting structure is essentially formed of a thermally conducting material and comprises an array of freestanding fins, studs or frames, or a grid of connected fins.

Due to the thermally conducting structure, the surface of the semiconductor device is enlarged. Since the solder can be made relatively thin, for example less than 1 μm, the solder does not limit the thermally conduction from the semiconductor device to the thermally conducting structure. Consequently, the semiconductor device provides a high thermal dissipation efficiency. Moreover, the semiconductor device has a good mechanical stability due to the absence of etched areas on the surface. In addition, the semiconductor device allows for re-working in case of defects by re-melting of the solder, removing the thermally conducting structure or a portion thereof and attaching a new thermally conducting structure or a portion thereof to the surface of the semiconductor device via soldering.

In an advantageous embodiment of the present invention, the semiconductor device further comprises a manifold layer attached to the thermally conducting structure. By using a manifold layer, it is possible to supply a cooling liquid or water to the structural elements of the thermally conducting structure. Thereby, a very high cooling efficiency of the semiconductor device can be obtained.

In another advantageous embodiment of the present invention, the semiconductor device is integrated into a device for jet impingement cooling. Due to the fact that the surface of the semiconductor device is enlarged by the thermally conducting structure, a good cooling performance of the semiconductor device can be achieved.

The present invention also provides a method for fabricating a semiconductor device. In a first step, a carrier having a seed layer is provided. A patterned mask layer is provided on the seed layer of the carrier afterwards, wherein the patterned mask layer has a recess structure. A thermally conducting material is deposited on the patterned mask layer to fill up the recess structure of the patterned mask layer, thus forming a thermally conducting structure. Subsequently, a solder is deposited on the thermally conducting structure. After that, the patterned mask layer and the seed layer between the structural elements of the thermally conducting structure are removed and the thermally conducting structure formed on the carrier is attached to a surface of a semiconductor device via soldering. After joining the thermally conducting structure gets released.

As described above, the thermally conducting structure allows for an enlargement of the surface of the semiconductor device and the solder can be rendered thinner that the thermally conduction from the semiconductor device to the thermally conducting structure is improved. Consequently, the method makes it possible to produce a semiconductor device with a high thermal dissipation efficiency by forming, attaching and transferring a thermally conducting structure, e.g. an island or a high-aspect ratio structure such as an array of freestanding studs, to the semiconductor device. Due to the fact that the thermally conducting structure is formed on the carrier and thus separately from the semiconductor device, the used process steps do not have to be compatible with the manufacturing of the semiconductor device. Moreover, the method provides the reworkability in case of defects merely by removing the thermally conducting structure or a portion thereof from the surface of the semiconductor device via re-melting of the solder and attaching a thermally conducting structure or a portion thereof formed on another carrier to the surface of the semiconductor device.

In an advantageous embodiment of the present invention, the further step of planarizing the patterned mask layer and the thermally conducting structure after said step of depositing the thermally conducting material is introduced in order to achieve a planar surface of the patterned mask layer and the thermally conducting structure.

In another advantageous embodiment of the present invention, a further step of coating the surface of the semiconductor device with an adhesion layer prior to said step of attaching the thermally conducting structure formed on the carrier to the surface of the semiconductor device is introduced. As a result, a bigger variety of possible solder materials is available in order to attach the thermally conducting structure to the semiconductor device.

In another advantageous embodiment of the present invention, the carrier is a manifold layer. Consequently, the semiconductor device can be provided with a liquid coolant, thus achieving a high cooling efficiency of the semiconductor device.

In another advantageous embodiment of the present invention, the method includes the step of providing the carrier as a transparent substrate coated with a polyimide layer, wherein the seed layer is being formed on top of the polyimide layer.

In this connection, it is preferred to remove the carrier after said step of attaching the thermally conducting structure formed on the carrier to the surface of the semiconductor device and to integrate the semiconductor device with the thermally conducting structure attached to the same into a device for jet impingement cooling. Since the surface of the semiconductor device is enlarged by the thermally conducting structure, a good cooling performance of the semiconductor device can be achieved.

The present invention can in particular be used to fabricate a multi-chip module having a high thermal dissipation efficiency. Accordingly, in yet another advantageous embodiment of the present invention, the semiconductor device comprises at least two semiconductor chips attached to a common substrate. Thereby, the method includes the step of attaching the thermally conducting structure to the surfaces of the semiconductor chips.

Concerning the term "surface" of the semiconductor device, the backside of the semiconductor device, that is defined as the side that comprises no device components, is preferred because the processing steps are less likely to harm the components and influence their functionality.

Figure 1:
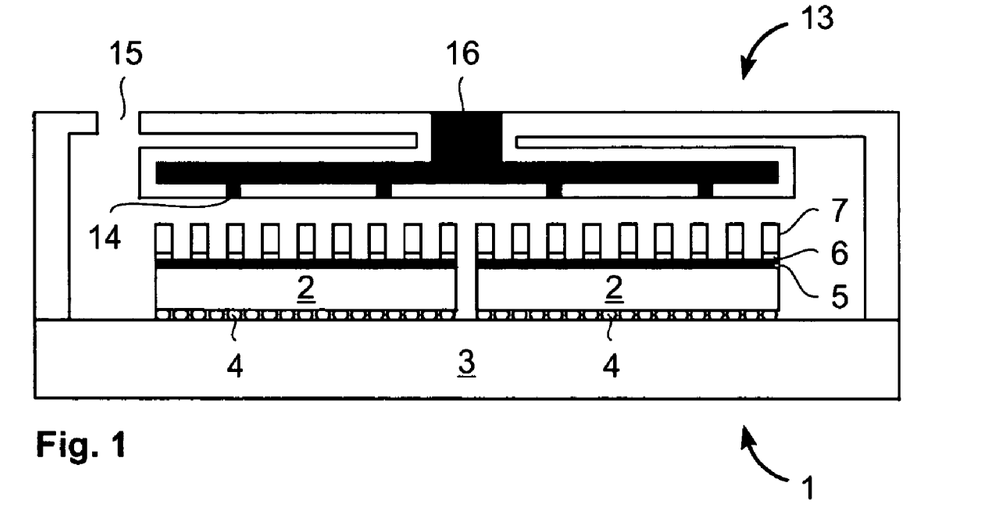
FIG. 1 is a cross-sectional view of a multi-chip module with two semiconductor chips according to a first embodiment of the present invention, which is integrated into a device for jet impingement cooling.

FIG. 1 shows a multi-chip module 1, according to a first embodiment of the present invention in a cross-sectional view, which is integrated into a device for jet impingement cooling 13. The multi-chip module 1 comprises a common substrate 3 carrying a multilayer interconnection structure thereon and two semiconductor chips 2 attached to the surface of the substrate 3 in a face-down state via solder balls 4. The semiconductor chips 2 are mounted onto the surface of the substrate 3 by a flip chip process such as the common C4 technology process.

Each of the semiconductor chips 2 comprises an adhesion layer 5 coating the backsides of the semiconductor chips 2. The adhesion layers 5 consist for example of nickel and gold.

The multi-chip module 1 further comprises a thermally conducting structure comprising an array of free-standing studs 7 attached to the adhesion layers 5 of the semiconductor chips 2 via solder bonds 6. The studs 7 are essentially formed of a thermally conducting material such as copper and preferably have a height of about or more than 100 µm. By means of the studs 7, the surface of the backsides of the semiconductor chips 2 is enlarged.

The solder bonds 6 have a thickness of about or less than 1 µm. The adhesion layer 5 has a thickness of about 1 µm. As a consequence, a thermally conduction from the backsides of the chips 2 to the studs 7 is improved.

The device for jet impingement cooling 13 comprises nozzles 14 in order to spray a cooling fluid 16 onto the backsides of the semiconductor chips 2. Due to the fact that the backside surface of each chip 2 is enlarged by the array of studs 7, a higher cooling performance is obtained. The fraction of cooling fluid 16 that evaporates or gets heated up and stays liquid during the cooling process exhausts through an outlet 15.

Figure 2:
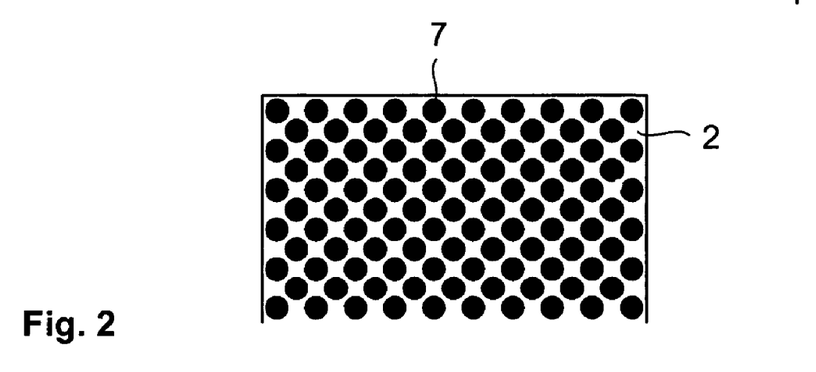
FIG. 2 is plan view of a semiconductor chip of the multi-chip module of FIG. 1.

FIG. 2 depicts a plan view of a semiconductor chip 2 of the multi-chip module 1 of FIG. 1. From this view, the array of free-standing studs 7 joined with the backside of the chip 2 can be seen. In an alternative embodiment, the semiconductor chip 2 may also comprise a thermally conducting structure with a different shape which consists for example of an array of free-standing fins attached to the backside thereon (not shown).

Figure 3A:
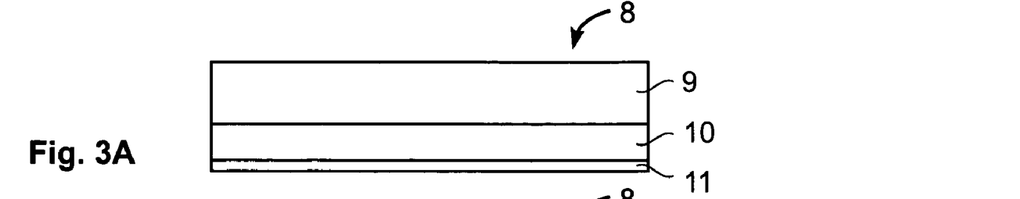
FIGS. 3A to 3F illustrate a fabrication process of the semiconductor chip of FIG. 2 in a cross-sectional view.

Next, the fabrication process of the semiconductor chip 2 of FIG. 2 will be described with references to FIGS. 3A to 3F. In a first step, a carrier 8 is provided having a seed layer 11, as indicated in FIG. 3A. The carrier 8 comprises a transparent substrate 9 of e.g. glass which is coated with a polyimide layer 10. The seed layer 11 that comprises an electroconductive material is being formed on top of the polyimide layer 10.

Figure 3B:
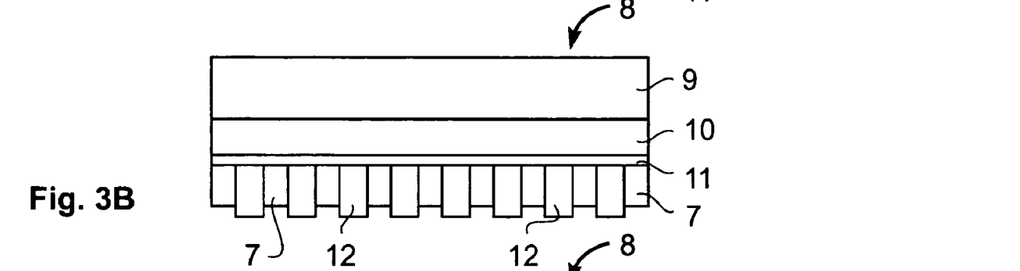

Thereafter, a mask layer 12, e.g. photoresist, is deposited on the seed layer 11 and patterned, thus forming a recess structure in the mask layer 12. Further, a thermally conducting material such as copper is deposited on the patterned mask layer 12 in order to fill up the recess structure of the patterned mask layer 12. The depositing of the thermally conducting material is e.g. done by electroplating. As a result, a thermally conducting structure 7 comprising an array of studs 7 is formed by the thermally conducting material in the recess structure of the patterned mask layer 12, as shown in FIG. 3B.

Figures 3C, 3D:
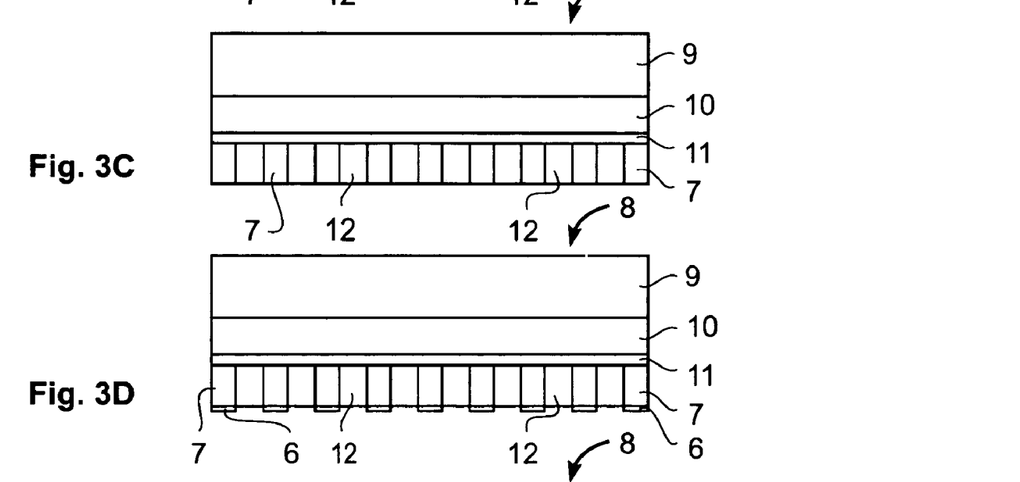

Afterwards, the patterned mask layer 12 and the thermally conducting structure 7 are planarized to achieve a planar surface of the patterned mask layer 12 and the thermally conducting structure 7, as indicated in FIG. 3C. This step is e.g. carried out by chemical and mechanical polishing (CMP).

Thereafter, a solder 6 is deposited on the studs of the thermally conducting structure 7, as shown in FIG. 3D. This can be achieved by electroplating, sputtering or evaporation. In the case of sputtering and evaporation, an additional patterned mask layer (not shown) is provided on the patterned mask layer 12 and removed after the solder depositing.

Figure 3E:
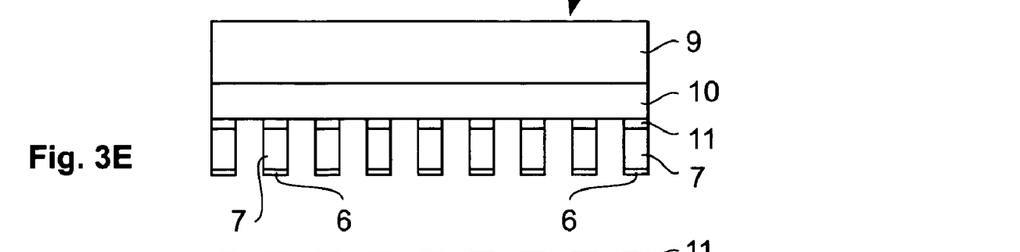

After that, the patterned mask layer 12 and the seed layer 11 are removed between the studs 7 of the thermally conducting structure, as shown in FIG. 3E. This is e.g. performed by an etching process.

Figure 3F:
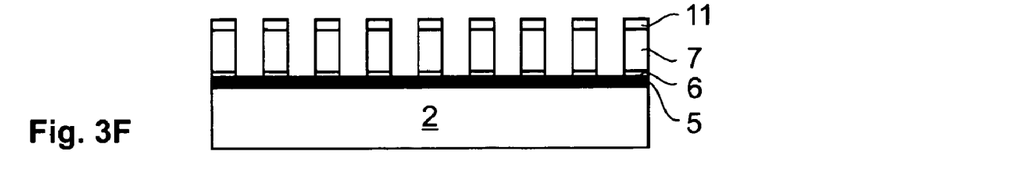

Afterwards, the studs 7 formed on the carrier 8 are solder-bonded and transferred to the backside of the semiconductor chip 2 which has been coated with an adhesion layer 5. At the end, the carrier 8 is removed by e.g. laser ablating of the polyimide layer 10, so that the semiconductor chip 2 with an array of free-standing studs 7 attached to the backside of the chip 2 is obtained, as indicated in FIG. 3F. Thereby each stud 7 is covered by the seed layer 11. For reasons of simplicity, the seed layer 11 covering the studs 7 has been left out in FIG. 1.

As the studs 7 are formed on the carrier 8 separately from the semiconductor chip 2 and the thermally conducting structure area is small, the described fabrication process is characterized by no or little mechanical stress induction to the semiconductor chip 2, thus allowing an enlargement of the backside surface of the chip 2 without great changes in chip backend processing, even by using different materials with even better properties than silicon. Furthermore, the semiconductor chip 2 with the studs 7 can be re-worked in case of defects by simply re-melting of the solder bonds 6, removing the studs 7 or a portion thereof from the backside of the semiconductor chip 2 and attaching newly formed studs 7 with a carrier 8 to the same via soldering.

In order to obtain the multi-chip module 1 as depicted in FIG. 1, two semiconductor chips 2 are processed according to the fabrication process shown in FIGS. 3A to 3F and are subsequently mounted onto the surface of a common substrate 3 by, for example, a standard C4 technology process. Afterwards, the multi-chip module 1 is integrated into a device for jet impingement cooling 13. Alternatively, the semiconductor chips 2 can be attached to the substrate 3 at first, and afterwards studs 7 formed on separate carriers 8 or one common carrier are transferred and bonded to the backsides of the semiconductor chips 2.

In contrast to the multi-chip module 1 depicted in FIG. 1 and the semiconductor chip 2 shown in FIG. 3F, respectively, the studs 7 can also be attached to the backside of the semiconductor chip 2 which is not coated with an adhesion layer 5. In such embodiments a reactive solder material is used as the solder 6 which directly joins with the backside of the semiconductor chip 2. However, the application of an adhesion layer 5 allows a bigger variety of solder materials which can be used.

Figure 4:
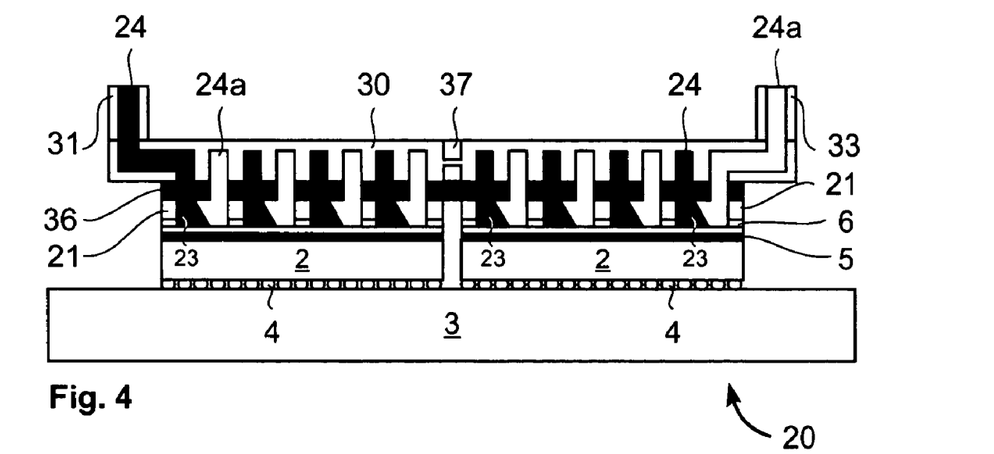
FIG. 4 is a cross-sectional view of a multi-chip module with two semiconductor chips according to a second embodiment of the present invention, which comprises a manifold layer.

Instead of integrating a multi-chip module 1 into a device for jet impingement cooling 13, the multi-chip module 1 and the semiconductor chips, respectively, can also be provided with micro channel or duct cooling. In this regard, FIG. 4 illustrates, in a cross-sectional view, a multi-chip module 20 according to a second embodiment of the present invention. This multi-chip module 20 also comprises two semiconductor chips 2 attached to the upper surface of a common substrate 3 in the face-down state via solder balls 4. The backsides of the semiconductor chips 2 are again each covered with an adhesion layer 5.

Instead of free-standing studs, the multi-chip module 20 further comprises two grids 21 of connected fins attached to each of the backsides of the semiconductor chips 2 for surface enlargement. These grids 21, which comprise a thermally conducting material such as copper, are bonded to the adhesion layers 5 coating the backsides of the chips 2 via solder bonds 6.

Figure 5:
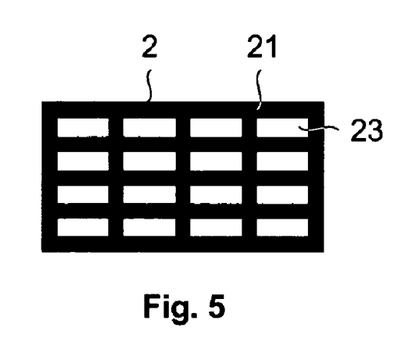
FIG. 5 is a plan view of a semiconductor chip of the multi-chip module of FIG. 4.

For this, FIG. 5 depicts a plan view of a semiconductor chip 2 of the multi-chip module 20 of FIG. 4 with a grid 21 of connected fins. The grid 21 comprises a plurality of recesses 23 exposing the backside surface of the semiconductor chip 2.

As can be seen from FIG. 4, the multi-chip module 20 further comprises a manifold layer 30 attached to the grids 21 of the semiconductor chips 2 via a sealing 36. The manifold layer 30 comprises an inlet 31 which can be connected to a liquid or water source (not shown) and an outlet 33. As can be deduced from the plan view of the manifold layer 30 shown in FIG. 6, the manifold layer 30 further comprises an inlet channel 32, an outlet channel 34 and a number of channels 35 extending from the inlet channel 32 and the outlet channel 34 towards the recesses 23 of the grids 21. The inlet 31 is connected thereby with the inlet channel 32 and the outlet 33 with the outlet channel 34.

In order to cool the backsides of the semiconductor chips 2, the inlet 31 of the manifold layer 30 is connected to a water or liquid source (not shown). Thus, a cooling liquid 24 flows towards the recesses 23 of the grids 21 via the inlet 31, the inlet channel 32 and respective ones of the channels 35 of the manifold layer 30, which can be seen from FIGS. 4, 5 and 6. The cooling liquid 24 then flows down into the recesses 23 of the grids 21, is warmed up and flows up as warmed cooling liquid 24a, as can be seen from FIG. 4. Subsequently, the warmed cooling liquid 24a flows through respective ones of the channels 35, the outlet channel 34 and the outlet 33 of the manifold layer 30, which can be seen from FIGS. 4 and 6.

The recesses 23 of the grids 21 preferably have a width of about 50 μm and a depth of about between 100 to 500 μm. Thus, the backside surface of the semiconductor chips is enlarged. In addition, the solder bonds 6 and the adhesion layers 5 of the multi-chip module 20 have thicknesses of less or about 1 μm, so that the thermally conduction from the backsides of the semiconductor chips 2 to the grids 21 of connected fins is improved. As a consequence, a higher cooling performance of the liquid or water-cooled multi-chip module 20 is realized.

The manifold layer 30 can comprise a rigid material like e.g. glass ceramics. In order to reduce stress induction to the multi-chip module 20 due to different thermal expansions of the manifold layer 30 and the semiconductor chips 2, it is preferred that the manifold layer 30 comprises the same material as the semiconductor chips 2, i.e. silicon.

Figure 6:
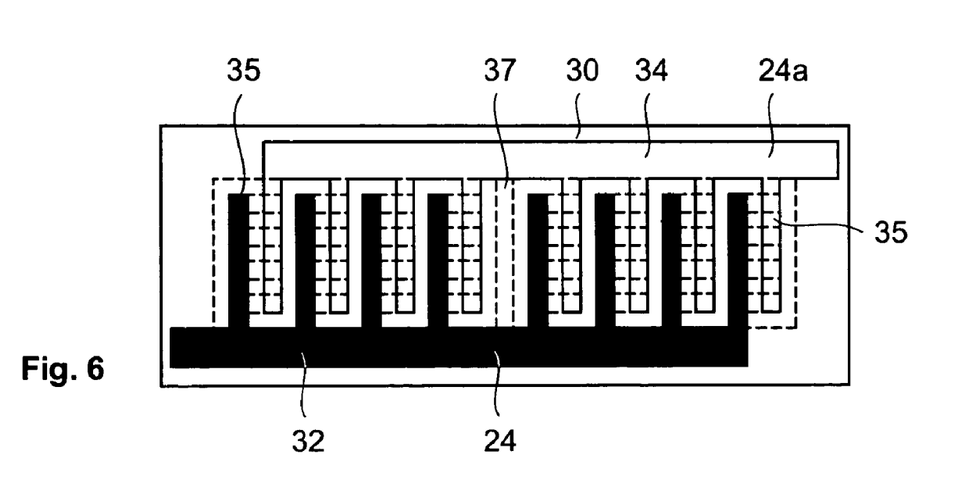
FIG. 6 is a plan view of the manifold layer of the multi-chip module of FIG. 4.

In order to accommodate geometrical imperfections between the semiconductor chips 2 and to enhance the structural flexibility of the multi-chip module 20, the manifold layer 30 comprises a thinning 37 between the semiconductor chips 2 and between the inlet and outlet channels 32, 34, as indicated in FIGS. 4 and 6. These imperfections are additionally compensated by the flexible sealing 36, which consists e.g. of polydimethylsiloxane (PDMS). The sealing 36 may also comprise an adhesive.

Alternatively, the manifold layer 30 can also comprise a flexible material having a low Young's modulus like PDMS. Thus, geometrical imperfections between the chips 2 and different thermal expansions of the manifold layer 30 and the chips 2 can also be compensated.

Figure 7:
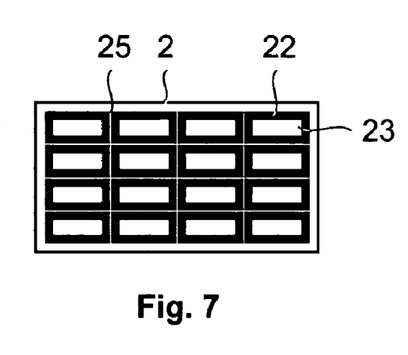
FIG. 7 is a plan view of a semiconductor chip of the multi-chip module of FIG. 4 according to an alternative embodiment of the present invention.

Since each of the grids 21 is attached to the whole backside surface of a respective one of the semiconductor chips 2, mechanical stress due to different thermal expansions of the grids 21 and the semiconductor chips 2 can occur. In order to reduce this problem, the backsides of the semiconductor chips 2 of the multi-chip module 20 can alternatively be provided with an array of free-standing frames 22, as indicated in the plan view of a semiconductor chip 2 in FIG. 7. The frames 22, which also comprise recesses 23 for receiving the cooling liquid 24, form a structure similar to the grid 21. Thereby, the manifold layer 30 can also be attached to the frames 22 via the sealing 36. Between the frames 22, stress release gaps 25 are provided which allow a reduction of mechanical stress induction caused by different thermal expansions of a semiconductor chip 2 and the frames 22.

Alternatively, the backsides of the semiconductor chips 2 of the multi-chip module 20 can also be provided with an array of free-standing studs or fins (not shown), whereas the manifold layer 30 can be attached to the studs or fins via a sealing. In such an embodiment, the cooling performance achieved by liquid or water cooling is possibly better due to a spreading and mixing of cooling liquid between the studs or fins as well. The delivery rate of the liquid or water source connected to the inlet 32 of the manifold layer 30 is possibly higher, however, due to an increased pressure drop between the studs or fins.

In order to produce a multi-chip module with a manifold layer, such as the multi-chip module 20 depicted in FIG. 4, the fabrication process described above with reference to FIGS. 3A to 3F can be utilized. After the steps of removing the carrier and mounting the semiconductor chips 2 onto a common substrate 3, a manifold layer is attached to the thermally conducting structure, i.e. a grid of connected fins or an array of frames, studs or fins, which is attached to the backsides of the semiconductor chips 2.

Instead of fabricating a multi-chip module by using a carrier comprising a transparent substrate and a polyimide layer, as illustrated in FIGS. 3A to 3F, a manifold layer can be used as carrier, as well. For this, FIGS. 8A to 8H illustrate the fabrication process of a multi-chip module 40 according to a third embodiment of the present invention.

Figures 8A, 8B:
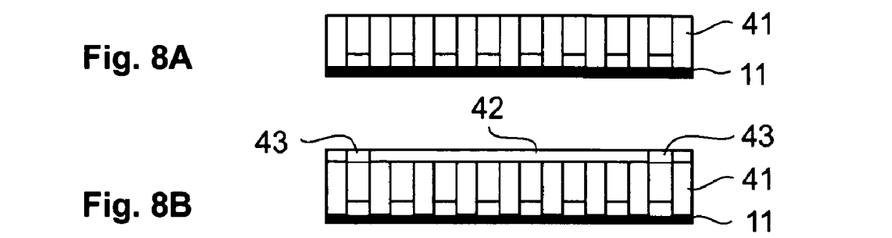
FIGS. 8A to 8H illustrate the fabrication process of a multi-chip module according to a third embodiment of the present invention, which comprises two semiconductor chips and two manifold layers attached to the same.

In a first step, a manifold structure or manifold layer 41 having an electroconductive seed layer 11 is provided, as shown in FIG. 8A. Afterwards, the manifold layer 41 is covered with a top sealing 42 comprising holes 43 which serve as future inlet and outlet.

Figure 8C:
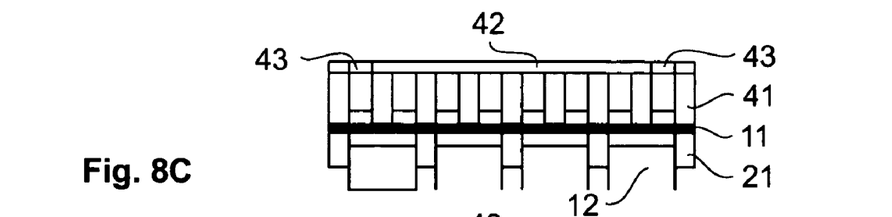

After that, a patterned mask layer 12, e.g. photoresist having a recess structure is provided on the seed layer 11. Subsequently, a thermally conducting material such as copper is deposited on the patterned mask layer 12 to fill up the recess structure of the patterned mask layer 12. This step is e.g. performed by electroplating. Thus, a thermally conducting structure 21 is formed by the thermally conducting material in the recess structure of the patterned mask layer 12 as can be seen in FIG. 8C. The thermally conducting structure 21 exhibits the geometrical shape of the grid 21 of connected fins, for instance, which is depicted in the plan view of FIG. 5. Alternatively, the thermally conducting structure 21 could also comprise an array of frames, studs or fins.

Figure 8D:
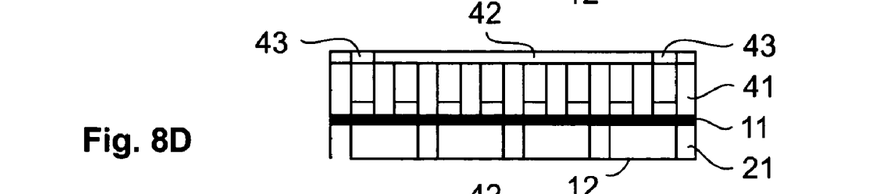
Figure 8E:
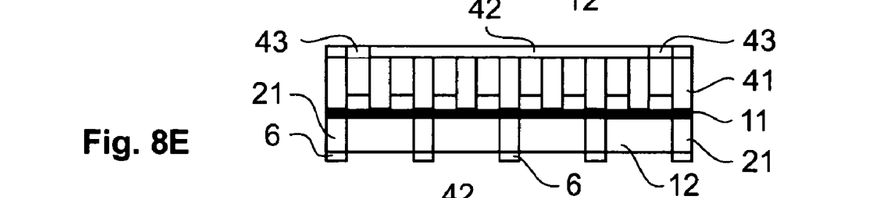

Referring to FIG. 8D, the patterned mask layer 12 and the thermally conducting structure 21 are planarized by e.g. chemical and mechanical polishing to achieve a planar surface of the patterned mask layer 12 and the grid 21. Afterwards, a solder 6 is deposited on the grid 21 of connected fins, as illustrated in FIG. 8E. This step is for example carried out by electroplating.

Figure 8F:
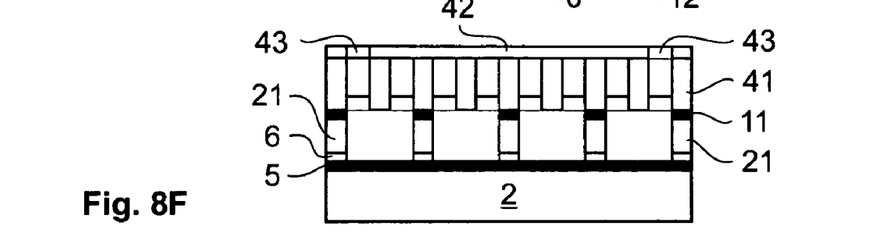

In a next step, depicted in FIG. 8F, the patterned mask layer 12 and the seed layer 11 between the fins of the grid 21 are removed by, for example, etching and the grid 21 of connected fins is transferred and solder-bonded to the backside of a semiconductor chip 2. As shown in FIG. 8F, the backside of the semiconductor chip 2 is again coated with an adhesion layer 5. As discussed before, the adhesion layer 5 can also be omitted.

Figure 8G:
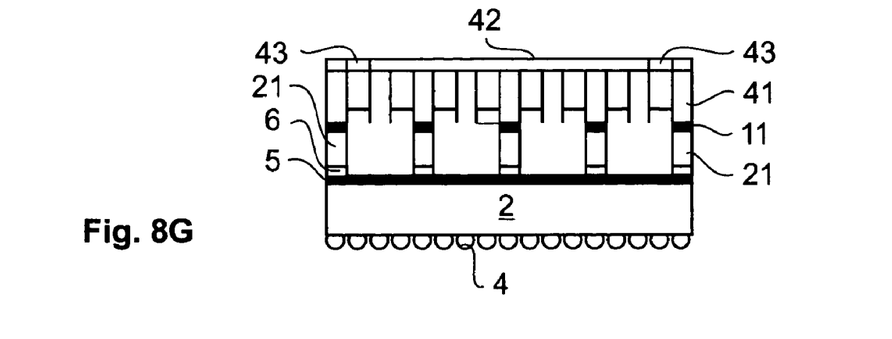

Referring to FIG. 8G, the front side of the semiconductor chip 2 is provided with solder balls 4, which can be performed by a standard C4 technology process. Afterwards, the semiconductor chip 2 depicted in FIG. 8G and a second chip 2 also fabricated in accordance with the process steps illustrated in FIGS. 8A to 8G are mounted onto the upper surface of a common substrate 3 via soldering in order to obtain the multi-chip module 40, which is depicted in FIG. 8H.

Similar to the fabrication process described above with reference to FIGS. 3A to 3F, the fabrication process illustrated in FIGS. 8A to 8H allows an enlargement of the backside surfaces of the semiconductor chips 2 with no or only little stress induction and without many changes in chip backend processing. The multi-chip module 40 or the semiconductor chips 2 can also be re-worked if required by re-melting of the solder bonds 6, removing a manifold layer 41 with a grid 21 and attaching another manifold layer 41 with a grid 21 to the backside of a semiconductor chip 2.

In an alternative embodiment, the fabrication process described with reference to FIGS. 8A to 8H can also be carried out with a bigger manifold layer, which extends over both of the semiconductor chips 2 when attached to the same (not shown).

Figure 8H:
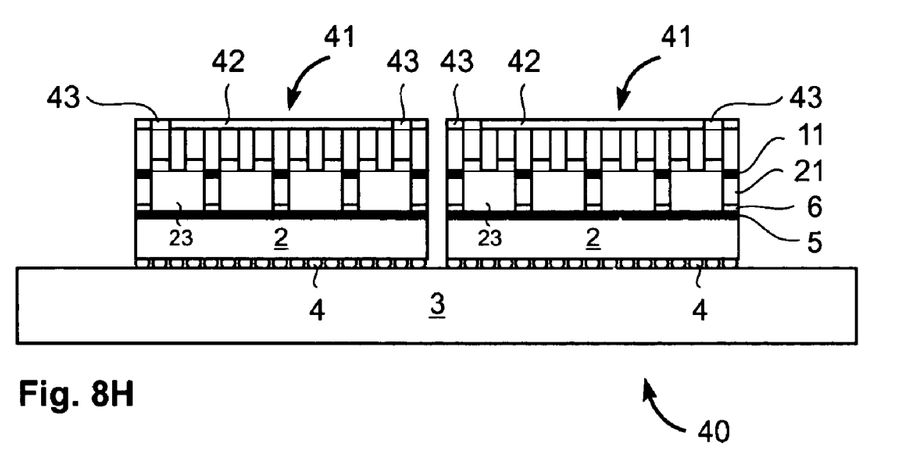

In contrast to the multi-chip module 20 of FIG. 4, the multi-chip module 40 depicted in FIG. 8H comprises two separate manifold layers 31. A further difference is that the manifold layers 41 are connected to the grids 21 without a sealing.

Figure 9:
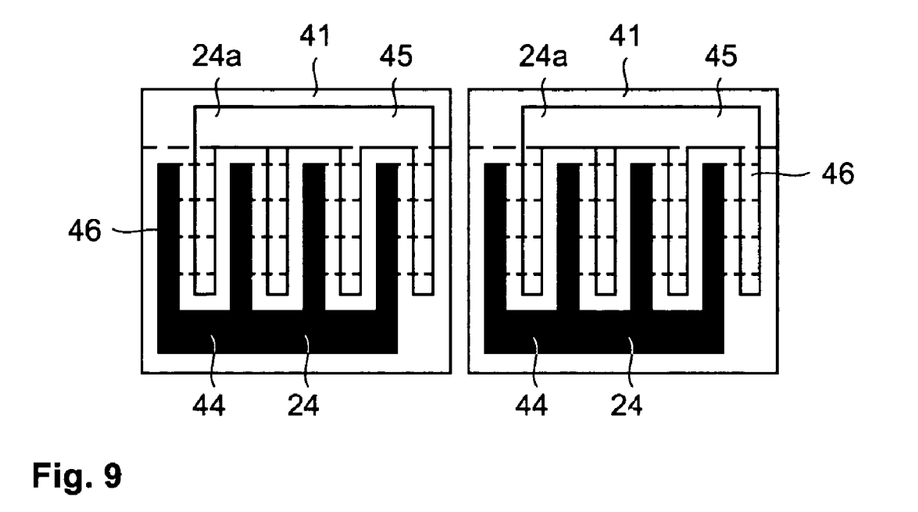
FIG. 9 is a plan view of the manifold layers of the multi-chip module of FIG. 8H.

FIG. 9 shows a plan view of the manifold layers 41 of the multi-chip module 40. Each of the manifold layers 41 comprises an inlet channel 44, an outlet channel 45 and channels 46 extending towards respective recesses 23 of the grids 21. The inlet and outlet channels 44, 45 are connected to respective holes 43 of the top sealings 42 of the manifold layers 41 depicted in FIG. 8H, which serve as inlets and outlets. Thus, a flow of cooling liquid or water towards and away from the recesses 23 of the grids 21 of connected fins can be established.

The manifold layers 41 can again comprise a rigid or flexible material having a relatively low Young's modulus. In the case of a rigid material, it is preferred that the manifold layers 41 comprises the same material as the semiconductor chips 2 in order to reduce different thermal expansions of the manifold layers 41 and the semiconductor chips 2.

Figure 10:
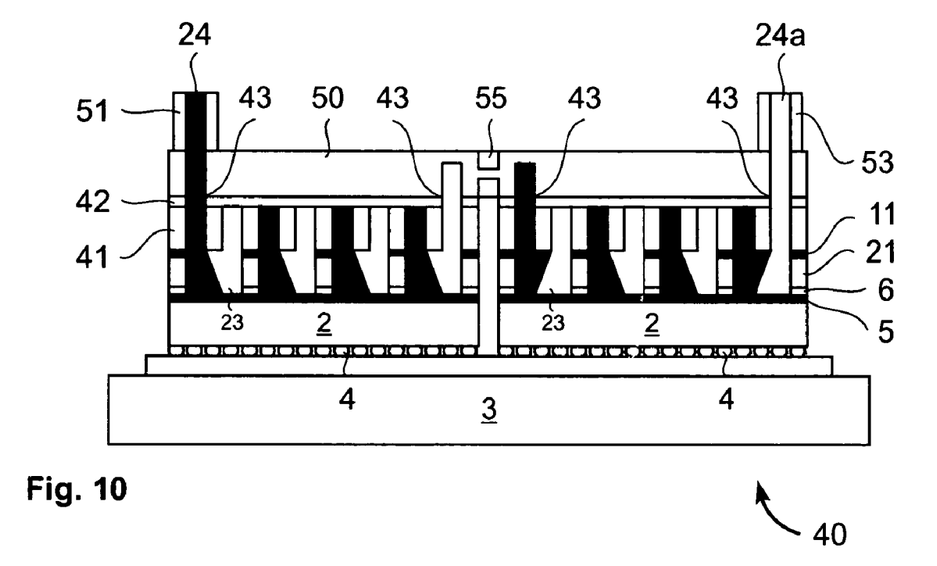
FIG. 10 is a cross-sectional view of the multi-chip module of FIG. 8H, which comprises an additional connection layer mounted on top of the manifold layers.

In order to connect the separate manifold layers 41 and their inlet and outlet channels 44, 45 with each other, the multi-chip module 40 can additionally be provided with a connection layer 50 attached to the manifold layers 41, as illustrated in FIG. 10. The connection layer 50 comprises an inlet 51 and an outlet 53. The inlet 51 is connected to an inlet channel 52 and the outlet 53 is connected to an outlet channel 54. The inlet channel 52 and the outlet channel 54 can be seen from the plan view of the connection layer 50 depicted in FIG. 11. The inlet and outlet channels 44, 45 of the manifold layers 41, as depicted in FIG. 9, are thereby connected to the inlet channel 52 and the outlet channel 54 of the connection layer 50 via respective ones of the holes 43.

Figure 11:
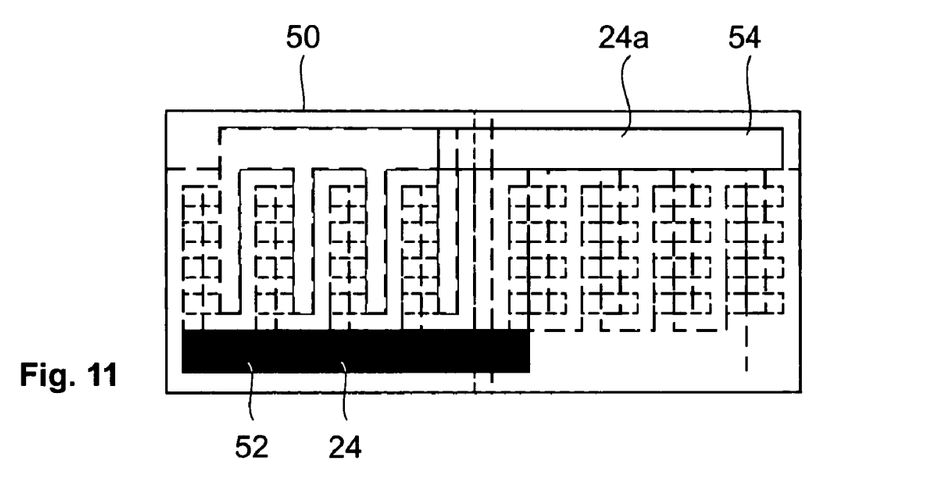
FIG. 11 is a plan view of the connection layer of the multi-chip module of FIG. 10.

Concerning the cooling process, a cooling liquid 24 such as water flows towards the recesses 23 of the grids 21 via the inlet 51 and the inlet channel 52 of the connection layer 50, the inlet channels 44 and respective ones of the channels 46 of the manifold layers 41, and warmed cooling liquid 24a flows away from the recesses 23 of the grids 21 towards the outlet 53 of the connection layer 50 via respective ones of the channels 46, the outlet channels 45 and the outlet channel 54, which can be seen from FIGS. 9, 10 and 11.

The connection layer 50 can also comprise either a rigid or a flexible material having a relatively low Young's modulus. In the case of a rigid material, the connection layer 50 preferably comprises the same material as the manifold layers 41 in order to reduce different thermal expansions. As illustrated in FIG. 10, the connection layer 50 can additionally be provided with a thinning 55 between the manifold layers 41 in order to compensate geometrical imperfections.

Figure 12A:
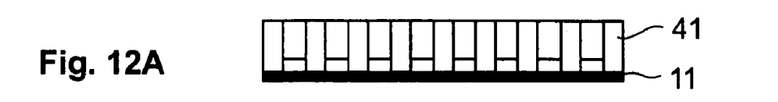
FIGS. 12A to 12G illustrate an alternative fabrication process of the multi-chip module of FIG. 8H.
Figure 12B:
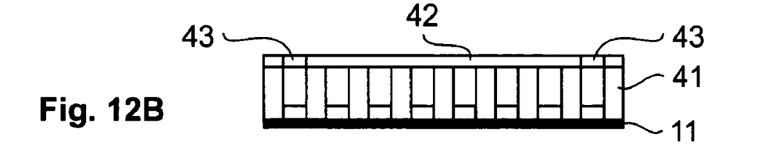
Figure 12C:
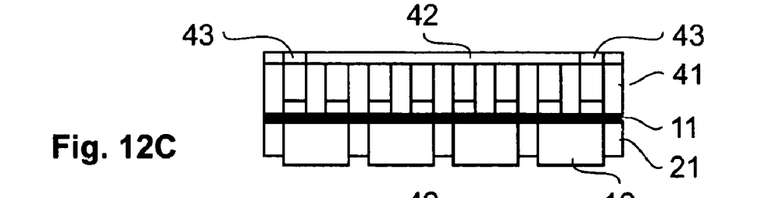
Figure 12D:
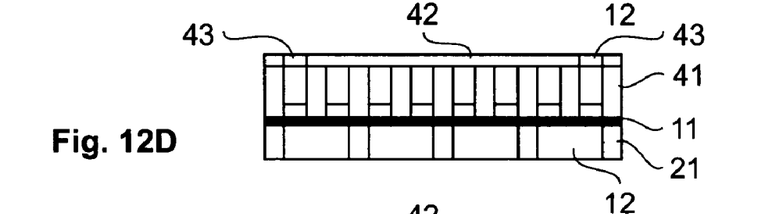
Figure 12E:
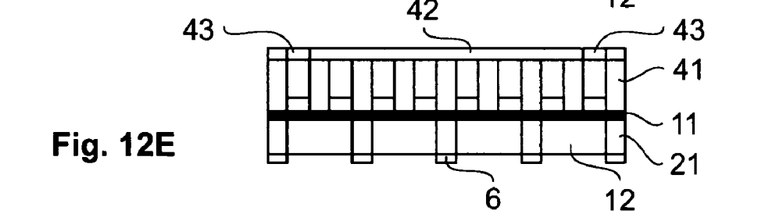
Figure 12F:
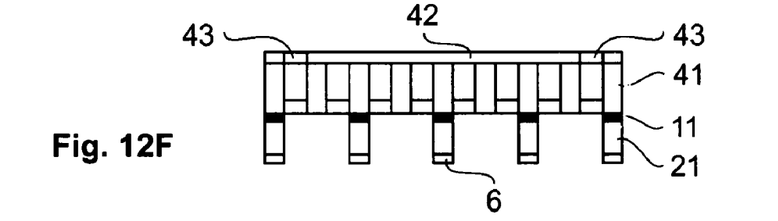

FIGS. 12A to 12G illustrate another fabrication process to provide the multi-chip module 40 as an alternative to the fabrication process described with reference to FIGS. 8A to 8H. This alternative fabrication process comprises the same or similar process steps in order to provide a manifold layer 41 with a thermally conducting structure attached to the same, e.g. a grid 21 of connected fins, which is depicted in FIG. 12F.

Figure 12G:
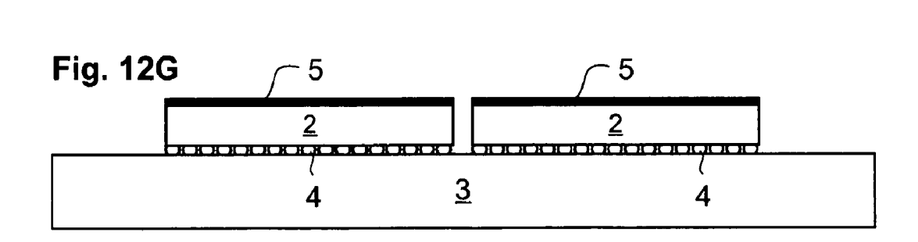

In contrast to the previously described fabrication process with reference to FIGS. 8A to 8H, semiconductor chips 2 are mounted onto the upper surface of a common substrate 3 separately from the manifold layers 41, which can be seen from FIG. 12G. The semiconductor chips 2 are again attached to the substrate 3 in a face-down state via solder balls 4 by utilizing e.g. a standard C4 technology process and comprise adhesion layers 5 coating the backsides.

Only subsequent to this process step, manifold layers 41 with grids 21 are attached to the backsides of the semiconductor chips 2 via soldering in order to obtain the multi-chip module 40 depicted in FIG. 8H. Thus, a melting of the solder bonds 6 joined with an adhesion layer 5 due to mounting of a chip 2 onto the substrate 3 via soldering and a complete or partial dissolving of a grid 21 from the backside of the semiconductor chip 2 as a consequence thereof, which might occur during the previously described fabrication process illustrated in FIGS. 8A to 8H, is reduced.

Figure 13:
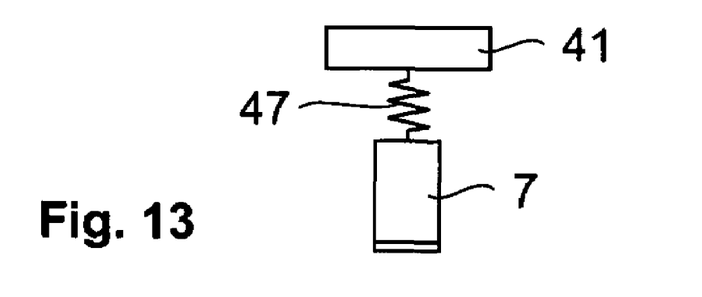
FIG. 13 is a schematic cross-sectional view of a part of a manifold layer attached to a stud via a spring element.
Figure 14:
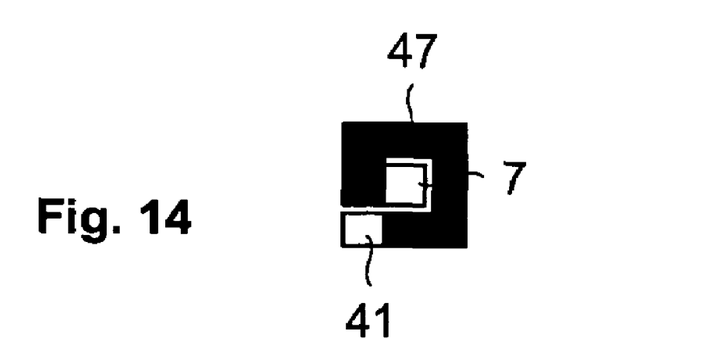
FIG. 14 is a plan view of the part of the manifold layer attached to the stud via the spring element.

Next, another aspect of the present invention will be described with reference to FIGS. 13 and 14. FIG. 13 depicts a schematic cross-sectional view of a part of a manifold layer 41 attached to a structural element of a thermally conducting structure, which is a stud 7, for instance, via a spring element 47 and FIG. 14 depicts a plan view of the same. By using spring elements 47 connecting the manifold layer 41 to the structural elements of a thermally conducting structure, the manifold layer 41 is mechanically decoupled from the thermally conducting structure.

The spring elements 47 can also be introduced between the manifold layers 41 and the grids 21 of the multi-chip module 40 of FIG. 8H and between the manifold layer 30 and the grids 21 of the multi-chip module 20 depicted in FIG. 4, respectively. As a consequence, geometrical imperfections and different thermal expansions of e.g. a manifold layer and a thermally conducting structure can be at least partially compensated so that mechanical stress induction to semiconductor chips and multi-chip modules, respectively, is further reduced. This allows the use of hybrid material systems with improved thermally capabilities such as solders for enhanced thermally transfer and reliability.

In order to fabricate a semiconductor chip or a multi-chip module with such spring elements connecting a manifold layer to a thermally conducting structure, a carrier comprising a manifold layer having a structured seed layer is provided in a first step. The structured seed layer provides spring elements formed out of partitions of the seed layer. As an example, the seed layer 11 of the manifold layer 41 depicted in FIGS. 8A and 12A can be partially formed in such a way as to provide spring elements. The subsequent processing steps are carried out similar to the fabrication processes described above with reference to FIGS. 8A to 8H and FIGS. 12A to 12G, respectively, and in such a way that the structural elements of the thermally conducting structure, e.g. the fins of a grid 21, are attached to these spring elements.

The thermally conducting structures depicted in the preceding figures all have structural elements with essentially vertical side walls. Furthermore semiconductor devices comprising thermally conducting structures with different geometrical shapes are imaginable. Such thermally conducting structures can also be formed and attached to a semiconductor device by utilizing one of the fabrication methods described above.

Figure 15:
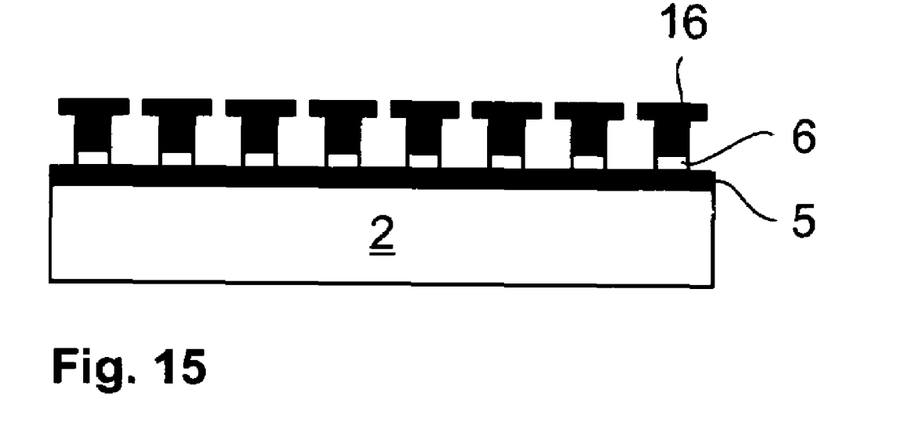
FIG. 15 is a cross-sectional view of a semiconductor chip comprising an array of T-shaped fins attached to the backside of the same.

As an example, FIG. 15 depicts, in a cross-sectional view, a semiconductor chip 2 with a thermally conducting structure comprising T-shaped fins 60 attached to the backside of the semiconductor chip 2 via solder bonds 6. The T-shaped fins 60 are essentially formed of a thermally conducting material like e.g. copper. The backside of the semiconductor chip 2 is again coated with an adhesion layer 5.

The T-shaped fins 60 build reentrant cavities acting as vapor traps, which are known to reduce the superheat by a factor of ten for two phase heat transfer systems. As a consequence, the semiconductor chip 2 shown in FIG. 15 or a multi-chip module comprising such semiconductor chips 2 can be integrated into a device for two phase heat transfer, thus improving the thermally performance and the critical heat flux.

While the present invention has been described in terms of specific embodiments, it is evident in view of the foregoing description that various variations and modifications may be carried out without departing from the scope of the invention.

As an example, the illustrated and described multi-chip modules and the respective fabrication processes are not limited to multi-chip modules having only two semiconductor chips.

Additionally, the fabrication methods described above are not limited to only semiconductor chips and multi-chip modules, respectively. The fabrication processes can also be carried out to transfer and attach thermally conducting structures formed on respective carriers to the backside surface of a semiconductor wafer, which is subsequently diced into semiconductor chips.

Moreover, the fabrication methods described above may also be used to manufacture other functional components on a carrier and to transfer and attach these components to the backside of a semiconductor device. Such functional components can e.g. comprise micro-electromechanical (MEMS) devices such as valves or pumps. Furthermore, the fabrication methods can be utilized to stack layers on the surface of a semiconductor device. Variations described for the present invention can be realized in any combination desirable for each particular application. Thus particular limitations, and/or embodiment enhancements described herein, which may have particular advantages to the particular application need not be used for all applications. Also, not all limitations need be implemented in methods, systems and/or apparatus including one or more concepts of the present invention. The invention also includes apparatus for implementing steps of a method of this invention, and methods implementing functions of an apparatus of this invention.

It is noted that the foregoing has outlined some of the more pertinent aspects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed is:

1. A method for fabricating a semiconductor device, the method comprising the steps of:

forming a thermally conducting structure on a carrier, said thermally conducting structure comprising a plurality of structural cooling elements of a high aspect ratio selected from a group consisting of: an array of free-standing fins, studs, and frames, and a grid of connected fins;

mounting semiconductor chips on an upper surface of a substrate;

coating backsides of the semiconductor chips with an adhesion layer;

removing the carrier;

attaching a manifold layer comprising the thermally conducting structure to the backside of the semiconductor chips via solder balls to obtain a multi-chip module, wherein said manifold layer comprises fluid inlets and outlets; and sealing the manifold layer to the semiconductor chips by melting the solder balls with the adhesion layer, such that the thermally conducting structure becomes attached to the adhesion layer.

2. The method of claim 1 further comprising:
re-melting the solder to remove at least a portion of the thermally conducting structure for re-working if a defect is discovered.

3. The method of claim 1 further comprising steps of:
removing the carrier; and
integrating the semiconductor device with the thermally conducting structure attached to the surface of the semiconductor device into a device for jet impingement cooling, said device comprising nozzles for spraying a cooling fluid through the inlets onto the backside of the semiconductor chips, wherein any remaining cooling fluid exhausts through the outlets.

4. The method of claim 3, wherein the manifold layer comprises an electroconductive seed layer and the method further comprises a step of providing the carrier in a form of a transparent substrate coated with a polyimide layer, the seed layer being formed on top of the polyimide layer.

* * * * *